United States Patent [19]

Amano et al.

[11] Patent Number: 5,191,589

[45] Date of Patent: Mar. 2, 1993

[54] LASER DRIVER AND OPTICAL DISK DRIVE APPARATUS

[75] Inventors: Yoshiro Amano, Yokohama; Kazuo Hokazono, Fujisawa; Tatsuo Shimofusa, Yamato, all of Japan

[73] Assignee: International Business Machines Corporation, Armonk, N.Y.

[21] Appl. No.: 783,793

[22] Filed: Oct. 28, 1991

[30] Foreign Application Priority Data

Jan. 17, 1991 [JP] Japan .................................. 3-44574

[51] Int. Cl.$^5$ .............................................. H01S 3/00
[52] U.S. Cl. ........................................ 372/38; 372/33; 372/29
[58] Field of Search ................ 372/38, 33, 29

[56] References Cited

U.S. PATENT DOCUMENTS 4,868,836 9/1989 Howard ................................. 372/38
5,062,113 10/1991 Takahashi ............................. 372/38

*Primary Examiner*—Georgia Y. Epps
*Attorney, Agent, or Firm*—H. St. Julian

[57] ABSTRACT

In response to a source current supply and a sink current supply, a switching circuit selectively forms a current path through which a constant source current from the source current supply flows into a laser in order to turn on the laser and a current path through which a constant source current from the source current supply flows into the sink current supply in order to turn off the laser.

12 Claims, 3 Drawing Sheets

SETTING CURRENT Ic1    0

SINK CURRENT Ib    0

SETTING CURRENT Ic2    0

WRITE DATA SIGNAL

Sd    H / L $\overline{Sd}$    H / L

SOURCE CURRENT Ia    0

SWITCHING CURRENT Isb    0

SWITCHING CURRENT Isa    0

LASER CURRENT Il    0

LASER DRIVER AND OPTICAL DISK DRIVE APPARATUS

BACKGROUND OF THE INVENTION

1. Field of the Invention

The present invention relates to a laser driver and an optical disk drive apparatus provided with said laser driver.

2. Description of the Related Art

In a laser driver, it is desirable to ground either an anode or a cathode of the laser to suppress a surge current. Moreover, to drive the capacity-loaded laser, it is advisable to provide connection between a transistor, which is a switching element for turning on or off a current to the laser, and the laser as a collector follower. To satisfy such conditions, a conventional laser driver uses either a sink (inflow) current supply or a source (outflow) current supply.

FIG. 3 shows an example of a conventional laser driver in which only a sink current supply is used. Referring to the figure, one terminal of a laser 1 is grounded and the other terminal is connected to a collector of one transistor 3A of a differential current switching circuit 3, which comprises a pair of NPN transistors 3A and 3B. The collector of the other transistor 3B is grounded. To the bases of the transistors 3A and 3B, if the laser driver is used for an optical disk drive apparatus, write data signals are alternately applied inversely. The emitters of the transistors 3A and 3B, which are coupled to each other, are connected to a sink current supply 5. The sink current supply 5 is formed into a current mirror circuit and receives a constant (sink) current 12 in response to a (setting) current I1 from a current setting circuit 7. In such a conventional construction, it is necessary to provide a negative source voltage −Vcc to the sink current supply 5. This involves a problem that the negative voltage source −Vcc must be provided in addition to a voltage source of the apparatus in which a circuit for driving the laser is used.

FIG. 4 shows an example of a conventional laser driver in which only a source current supply is used. Referring to the figure, one terminal of a laser 1 is grounded and the other terminal is connected to the collector of one transistor 13A of a differential current switching circuit 13, which comprises a pair of PNP transistors 13A and 13B. The collector of the other transistor 13B is grounded. To the bases of the transistors 13A and 13B, if the laser driver is used for an optical disk drive apparatus, write data signals are alternately applied inversely. The emitters of the transistors 13A and 13B, which are connected to each other, are connected to a source current supply 15. The source current supply 15 is formed into a current mirror circuit and provides a constant (source) current 14 in response to a setting current 13 from a current setting circuit 17. In such a conventional construction, a negative voltage source −Vcc is not needed, but PNP transistors must be used as switching elements. However, the PNP transistors, their switching operations being generally slow, causes a problem that it will be difficult to increase a switching speed of the laser.

SUMMARY OF THE INVENTION

An object of the present invention is to provide a laser driver in which a switching speed can be easily increased.

The present invention is intended to provide both a source current supply and a sink current supply and a switching means for selectively forming either a current path through which a constant source current from said source current supply flows into a laser to turn the laser on or a current path through which at least a part of said constant source current from said source current supply flows into said sink current supply to turn the laser off and to use NPN transistors as switching elements for said switching means without the need of any negative voltage source.

The foregoing and other objects, features and advantages of the invention will be apparent from the following more particular description of preferred embodiments of the invention, as illustrated in the accompanying drawing.

DETAILED DESCRIPTION

Figure 1:
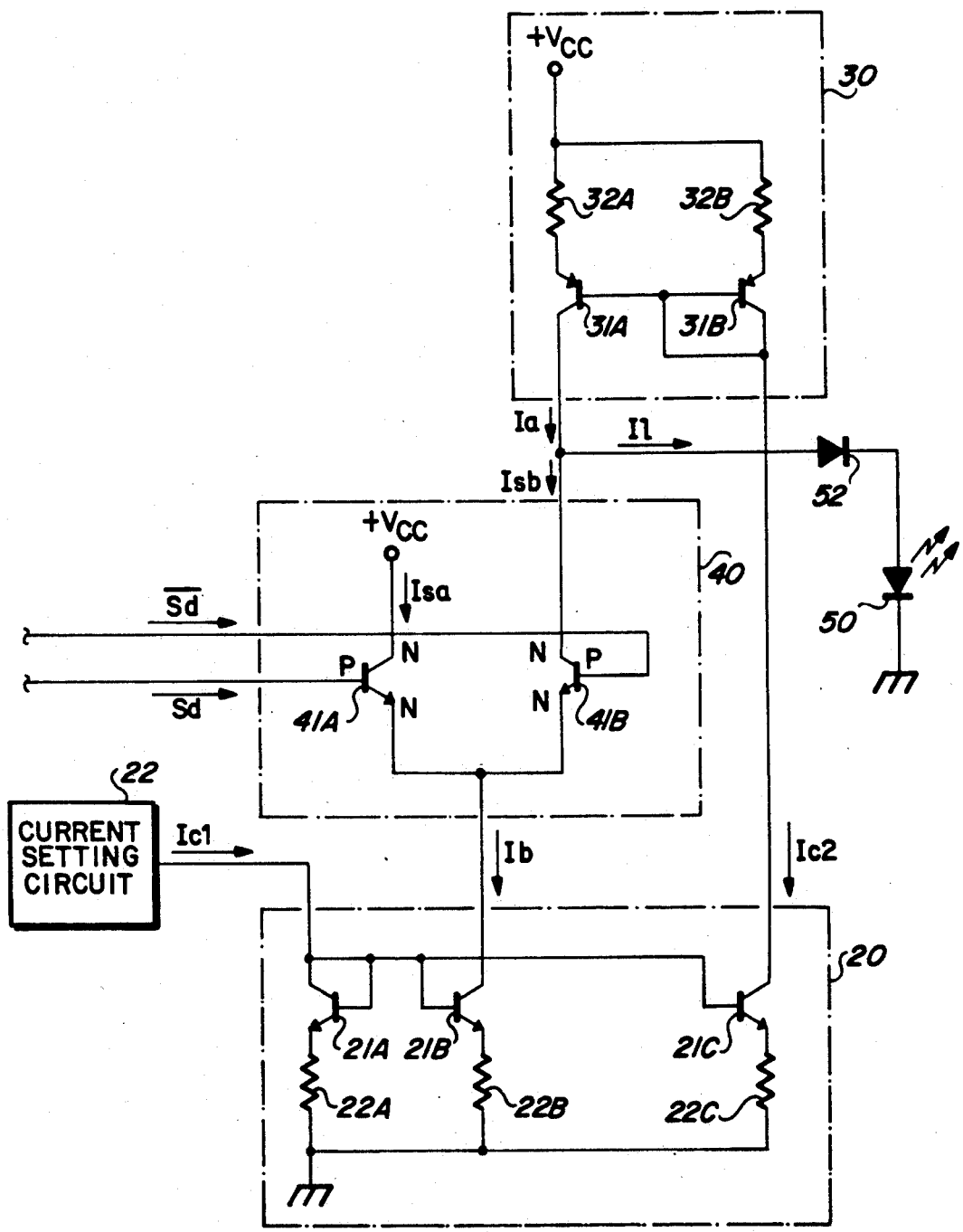
FIG. 1 is a circuit diagram showing an embodiment of a laser driver constructed in accordance with the present invention.
Figure 2:
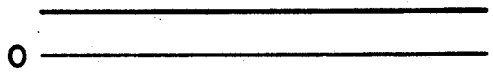
FIG. 2 is time charts indicating current signals in each part of said embodiment.
Figure 2:
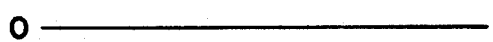
Figure 2:
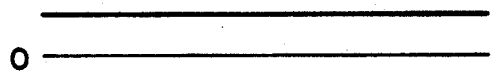
Figure 2:
Figure 2:
Figure 2:
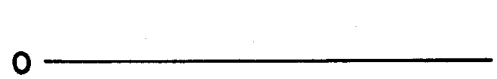
Figure 2:
Figure 2:
Figure 2:
Figure 3:
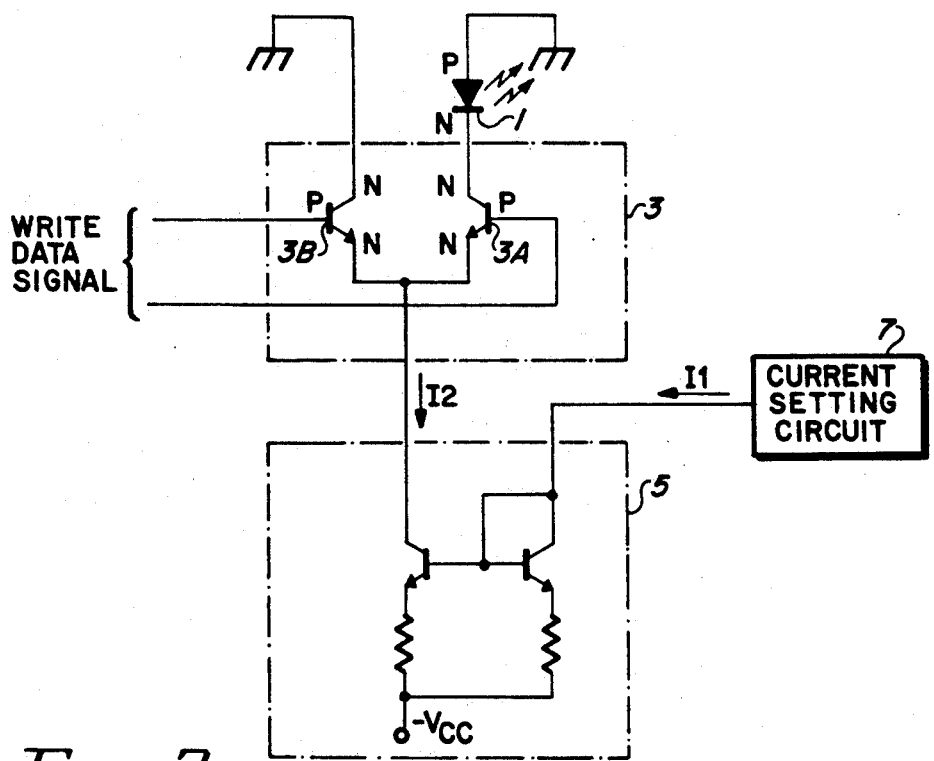
FIG. 3 is a circuit diagram showing the construction of an example of a conventional laser driver.
Figure 4:
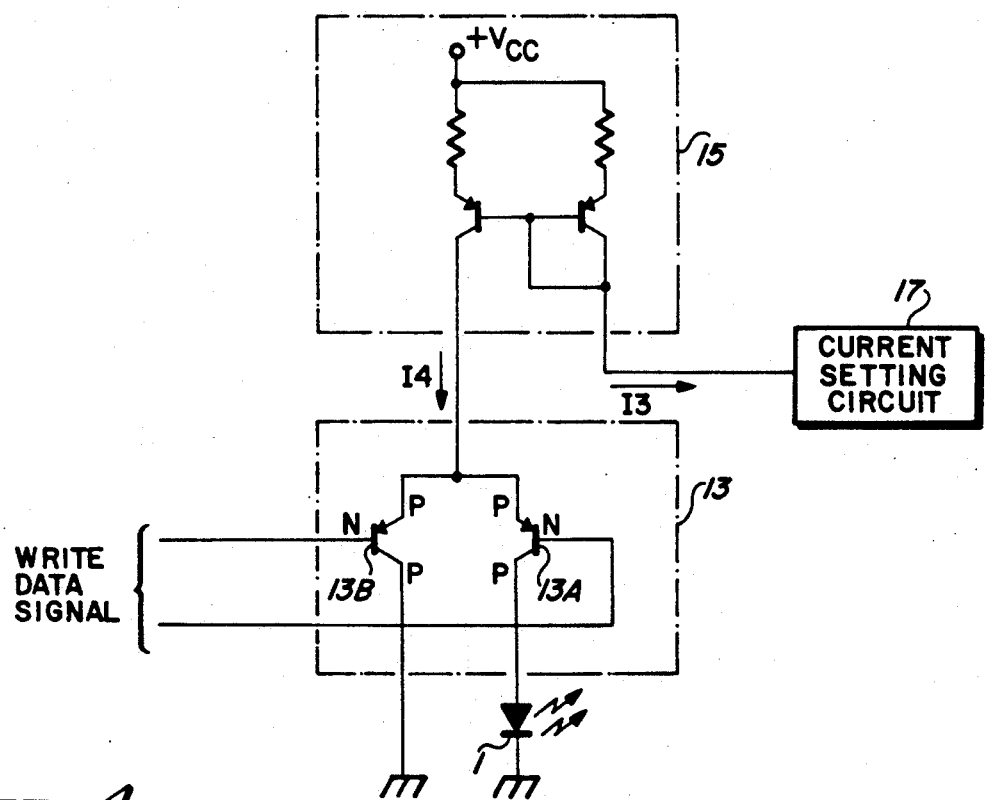
FIG. 4 is a circuit diagram showing the construction of another example of the conventional laser driver.

In the following, an embodiment of the present invention is described by reference to drawings. FIG. 1 shows an embodiment of a laser driver constructed in accordance with the present invention and FIG. 2 shows time charts of signals related to said embodiment.

Referring to FIG. 1, a sink current supply 20 is formed into a current mirror circuit comprising NPN transistors 21A into which a setting current Ic1 flows, 21B, and 21C and resistances 22A, 22B, and 22C. The base and the collector of the transistor 21A, the base of the transistor 21B, and the base of the transistor 21C are connected to one another and thereby a collector voltage of the transistor 21A is applied to the base of the transistor 21B and the base of the transistor 21C. The emitters of the transistors 21A, 21B, and 21C are grounded through the resistances 22A, 22B, and 22C, respectively. In response to a value of the setting current Ic1, currents that flow through the transistor 21B and a current that flows through the transistor 21C is a setting current Ic2 by which an outflow current of a source current supply 30 is established.

The source current supply 30 is formed into a current mirror circuit comprising PNP transistors 31A and 31B and resistances 32A and 32B and thereby respective bases of the transistors 31A and 31B are supplied with the setting current Ic2 from the sink current supply 20. The respective emitters of the transistors 31A and 31B are connected to a positive voltage source +Vcc through the resistances 32A and 32B. In response to a value of the setting current Ic2, a current that flows through the transistor 31A is determined. The current that flows through the transistor 31A is a source current Ia, which is an outflow current of the source current supply 30.

The flow of the source current Ia from the source current supply 30 is separated into two paths; one is a path to a differential switching circuit 40, which is a switching means and the other is a path to a laser 50 through a diode 52 for preventing a back current. Now a current from the source current supply 30 that flows into the switching circuit 40 and a current from the source current supply 30 that flows into the laser 50 are referred to as a switching current Isb and a laser current Il, respectively. The switching circuit 40 includes a pair of NPN transistors 41A and 42B. To the base of the transistor 41A, if the embodiment is applied to a laser driver in an optical disk drive apparatus, a write data signal Sd is applied, and to the base of the transistor 41B an inverted signal of the write data signal Sd is applied. The collector of the transistor 41B is connected to the source current supply 30 and the laser 50, the collector of the transistor 41A is connected to a positive voltage source +Vcc, and thereby when the transistor 41A is on, a switching current Isa flows into the transistor 41A. When the transistor 41B is on, the switching current Isb flows into the transistor 41B. The emitters of the transistors 41A and 41B, which are coupled to each other, are connected to the sink current supply 20. The sink current supply 20 and the source current supply 30 are formed so that the source current Ia and the sink current Ib are the same.

In the following, the operations of the embodiment are described by reference to FIG. 2 in addition to FIG. 1. The setting current Ic1 from a current setting circuit 22 determines a sink current Ib of the sink current supply 20 and a setting current Ic2 for the source current supply 30 and the setting current Ic2 determines the source current Ia of the source current supply 30. As described above, the source current Ia and the sink current Ib are the same. The write data signal Sd and its inverted signal $\overline{Sd}$ are inputted to the bases of the transistors 41A and 41B, respectively and thereby when the transistors 41A and 41B become on and off, respectively, the switching current Isa, which flows in the transistor 41A will become the same with the sink current Ib and the switching current Isb, which flows into the transistor 41B will become zero. A laser current Il will therefore become equal to the source current Ia and the laser 50 will be turned on. On the other hand, when the transistors 41A and 41B become off and on, respectively, the switching current Isa, which flows into the transistor 41A, will become zero and the switching current Isb which flows into the transistor 41B will become equal to the sink current Ib, that is, the source current Ia. The laser current Il will therefore become zero and the laser 50 is turned off.

According to the embodiment shown above, under a desired condition for driving the laser 50, that one terminal of the laser 50 remains grounded and the transistor 41B, which is a switching element, connects to the laser 50 through a collector follower, a NPN transistor of a high switching speed is used for the transistor 41B, which is a switching element and thereby a high-speed switching operation in several nanoseconds can be easily performed. Further, the embodiment has the advantage that a positive voltage source provided to an apparatus provided with a laser driver can be used as it is without the need of any negative voltage source.

In said embodiment, a value of the source current Ia is equal to that of the sink current Ib. However, it is not always necessary that the values of the source current Ia and the ink current Ib accord with each other. It will be appreciated that a part of the source current Ia can pass to the sink current supply to decrease a current that flows into the laser for the purpose of on to off switching. In the embodiment, circuits are so constructed that the setting current Ic2 to the sink current supply 20 controls the source current Ia from the source current supply 30 and the source current becomes equal to the sink current Ib. However, it will be appreciated that other circuits can be formed so that the source current Ia becomes equal to the sink current Ib. It will be appreciated also that the sink current supply 20 and the source current supply 30 may be formed into some circuit than a current mirror. It will be appreciated also that the switching means may be of other type than the differential. It will be appreciated that the present invention can be applied to an optical communication apparatus, a laser printer, etc. in addition to an optical disk drive apparatus provided with a laser driver.

While the invention has been particularly shown and described with reference to preferred embodiments thereof, it will be understood by those skilled in the art that various changes in form and details may be make therein without departing from the spirit and scope of the invention.

What is claimed is:

1. A laser driver apparatus comprising:
    a laser;
    means, coupled to the laser, for supplying a first current signal;
    means, coupled to the first current signal supplying means, for supplying a second current signal; and
    means, coupled to the first and the second current signal supplying means, for selectively forming a first current path through which the first current signal flows into the laser or a current path through which at least a part of the first current signal flows into the second current signal supplying means.

2. The laser apparatus as set forth in claim 1 further includes means, coupled to the second current supplying means, for controlling the magnitude of the second current signal.

3. The laser apparatus as set forth in claim 2 wherein the first current signal and the second current signal are of equal magnitude and wherein the selectively forming means directs the first current signal either into the laser or into the second current supplying means.

4. The laser apparatus as set forth in claim 3 wherein the selectively forming means is a differential switching circuit., 5. The laser apparatus as set forth in claim 4 wherein the first current supplying means is a source current supply and wherein the first current signal is a first constant current signal.

6. The laser apparatus as set forth in claim 5 where the second current supplying means is a sink current supply and wherein the second current signal is a second constant current signal.

7. An optical disk drive apparatus comprising:
    a laser for irradiating a laser beam on an optical disk;
    means, coupled to the laser, for supplying a first current signal;
    means, coupled to the first current signal supplying means, for supplying a second current signal; and
    means, coupled to the first and the second current signal supplying means and responsive a data input signal, for selectively forming a first current path through which the first current signal flows into the laser or a current path through which at least a part of the first current signal flows into the second current signal supplying means.

8. The drive apparatus as set forth in claim 7 further includes means, coupled to the second current supplying means, for controlling the magnitude of the second current signal.

9. The drive apparatus as set forth in claim 8 wherein the first current signal and the second current signal are of equal magnitude and wherein the selectively forming means directs the first current signal either into the laser or into the second current supplying means.

10. The drive apparatus as set forth in claim 9 wherein the selectively forming means is a differential switching circuit.

11. The drive apparatus as set forth in claim 10 wherein the first current supplying means is a source current supply and wherein the first current signal is a first constant current signal.

12. The drive apparatus as set forth in claim 11 where the second current supplying means is a sink current supply and wherein the second current signal is a second constant current signal.

* * * * *